(12) United States Patent
Jaakkola et al.

(10) Patent No.: US 8,786,166 B2
(45) Date of Patent: Jul. 22, 2014

(54) MICROMECHANICAL RESONATOR ARRAY AND METHOD FOR MANUFACTURING THEREOF

(75) Inventors: Antti Jaakkola, Espoo (FI); Tuomas Pensala, Espoo (FI); Jyrki Kiihamäki, Espoo (FI)

(73) Assignee: Teknologian Tutkimuskeskus VTT, Espoo (FI)

( * ) Notice: Subject to any disclaimer, the term of this patent is extended or adjusted under 35 U.S.C. 154(b) by 369 days.

(21) Appl. No.: 13/209,099

(22) Filed: Aug. 12, 2011

(65) Prior Publication Data

US 2012/0038431 A1    Feb. 16, 2012

(30) Foreign Application Priority Data

Aug. 13, 2010    (FI) .................................... 20105849

(51) Int. Cl.
*H01L 41/09*    (2006.01)
(52) U.S. Cl.
USPC .......................... 310/353; 310/311; 310/328
(58) Field of Classification Search
USPC ......... 310/311, 328, 345, 353, 370; 29/25.35; 333/186–189
See application file for complete search history.

(56) References Cited

U.S. PATENT DOCUMENTS

| 4,719,383 | A | 1/1988 | Wang et al. | |
|---|---|---|---|---|
| 2004/0113722 | A1* | 6/2004 | Bircumshaw et al. | 333/197 |
| 2009/0009269 | A1* | 1/2009 | Nguyen et al. | 333/199 |
| 2010/0127596 | A1 | 5/2010 | Ayazi et al. | |
| 2011/0199167 | A1* | 8/2011 | Lutz et al. | 333/186 |
| 2012/0248243 | A1* | 10/2012 | Greenyer | 244/72 |

OTHER PUBLICATIONS

Demirci et al., "Mechanically Corner-Coupled Square Microresonator Array for Reduced Series Motional Resistance," Journal of Microelectromechanical Systems, Dec. 2006, vol. 15, No. 6, pp. 1419-1436.
Jaakkola et al., "Piezoelectrically transduced Single-Crystal-Silicon Plate Resonators," IEEE International Ultrasonics Symposium Proceedings, 2008, p. 717-720.
Lee et al., "Mechanically-Coupled Micromechanical Resonator Arrays for Improved Phase Noise," IEEE International Ultrasonics, Ferroelectrics, and Frequency Control Joint 50th Anniversary Conference, 2004, p. 144-150.
Office Action from Finnish patent application. 20105849 mailed Apr. 1, 2011.
Wang et al., "Sputtered C-axis Inclined Piezoelectric Films and Shear Wave Resonators," IEEE Xplore, 1983, p. 144-150.

\* cited by examiner

*Primary Examiner* — Thomas Dougherty
(74) *Attorney, Agent, or Firm* — Birch, Stewart, Kolasch & Birch, LLP

(57) ABSTRACT

The invention relates to a microelectromechanical resonators and a method of manufacturing thereof. The resonator comprises at least two resonator elements made from semiconductor material, the resonator elements being arranged laterally with respect to each other as an array, at least one transducer element coupled to said resonator elements and capable of exciting a resonance mode to the resonator elements. According to the invention, said at least one transducer element is a piezoelectric transducer element arranged laterally with respect to the at least two resonator elements between the at least two resonator elements and adapted to excite to the resonator elements as said resonance mode a resonance mode whose resonance frequency is dependent essentially only on the $c_{44}$ elastic parameter of the elastic modulus of the material of the resonator elements. By means of the invention, electrostatic actuation and problems associated therewith can be avoided and accurate resonators can be manufactured.

35 Claims, 11 Drawing Sheets

MICROMECHANICAL RESONATOR ARRAY AND METHOD FOR MANUFACTURING THEREOF

FIELD OF THE INVENTION

The invention relates to micromechanical resonators and, in particular, resonator arrays, and a method for producing the same. Such resonator arrays comprise the features of the preamble of claim 1. In particular, the invention relates to Lamé mode resonators.

BACKGROUND OF THE INVENTION

Resonators are commonly used in electronics for providing a signal with accurate and stable frequency. The resonators are mostly made using quartz crystals, which have a good accuracy and temperature stability of frequency. However, the production process for producing crystal resonators is different from the process of producing most other electrical circuits, which are mainly produced of silicon. Therefore, the quartz crystal resonators are usually separate components, whereby separate phases are required in the production process of electronic devices.

The quartz crystal components also tend to be large in size. It would be desirable to provide MEMS resonators made of silicon or other semiconductor materials in order to facilitate integration with e.g. silicon based components.

One problem associated with silicon based resonators relates to their actuation. In electrostatic actuation electrodes are placed on one or more sides of the resonator body in such a way that a narrow gap is formed in between the resonator body and the electrode. A voltage between the resonator and electrodes results in an electrostatic force, which can be used for driving square-extensional or Lamé resonance. For example, Mattila et al, "*Silicon Micromechanical Resonators for RF-Applications*", Physica Scripta. Vol. T114, 181-183, 2004, show an electrostatically actuated silicon resonator exhibiting square-extensional mode. However, to obtain strong enough electromechanical coupling, electrostatic actuation requires in general large (>20 V) bias voltages and narrow (<200 nm) gaps between a transducer element and the resonator. The bias and gap constraints are considerable disadvantages as concerns IC design and MEMS processing. In particular, the bias constraint is a complication for oscillator drive IC design, as low-cost processes are not compatible with voltages less than ~5V and the on-IC DC voltage generation is power consuming. The gap constraint is a process complication, because typical commercial MEMS processes are only capable of >=2 μm gaps. Narrow gaps are also an ESD risk, reducing device reliability.

It is also known to use piezoelectric actuation with a piezoelectric film grown on the resonator structure, but this approach is suitable only for exciting certain resonance modes. For example, the Lamé mode is problematic for piezoelectric actuation methods in single-crystal resonators such as silicon plate resonators. Previously, the Lamé mode has been piezoelectrically successfully produced only to quartz or special ceramic crystal structures such as 155° rotated Y-cut $LiNbO_3$ plates (e.g. Nakamura, K. et al, "*Lame-mode piezoelectric resonators and transformers using $LiNbO_3$ crystals*" Ultrasonics Symposium, 1995. Proceedings., 1995 IEEE, 7-10 Nov. 1995, vol. 2, 999-1002).

Another problem associated with silicon based resonators is that they have a high temperature drift of the resonance frequency. The drift is mainly due to the temperature dependence of the Young modulus of silicon, which causes a temperature coefficient of frequency (TCF) approx. −30 ppm/C. This causes the resonance frequency to fluctuate due to changes in ambient temperature. It is possible to compensate the temperature dependence with a temperature sensor and related electronic control circuitry, but it has not been possible to provide a resonator with sufficiently low temperature drift with low cost technology which would be suitable for mass production applications and would compete with quartz quality. Also, the use of a temperature compensation circuit increases the consumption of energy, which is a significant disadvantage especially in battery operated devices. Further, the compensation circuit tends to increase electric noise in the resonator circuit. It is also possible to stabilize the temperature of the resonator with temperature isolation and controlled warming/cooling of the resonator. However, this solution also increases the energy consumption of the device, and makes the device complicated to produce. The temperature compensation circuits are also slow in controlling, and cannot therefore compensate fast or large changes in ambient temperature sufficiently well.

J. S. Wang et al, "*Sputtered C-Axis Inclined Piezoelectric Films and Shear Wave Resonators*", Presented at the 37*th Frequency Control Symp., Philadelphia*, 1-3 Jun. 1983, 1983, 1-3, present that the p+-doped silicon appears to have positive temperature coefficient and in combination with ZnO and AlN films such silicon can be used for manufacturing inclined-angle shear mode resonators with an overall temperature coefficient near zero.

Lately it has been shown by A. K. Samarao et al, "*Passive TCF Compensation in High Q Silicon Micromechanical Resonators,*" IEEE International Conference on Micro Electro Mechanical Systems (MEMS 2010), 2010, pp. 116-119, that heavy p-doping of silicon dramatically reduces the TCF of a bulk acoustic wave resonator with enhanced shear wave contribution. However, the abovementioned problems relating to actuation of the resonator remain.

US 2010/0127596 discloses a MEMS resonator which includes a boron-doped resonator region in order to reduce the TCF. The resonator may comprise a piezoelectric layer on top of the resonator and input/output electrodes on top of the piezoelectric layer. Such structure is not capable of producing a Lamé mode in a plate-shaped resonator.

It has also been suggested to use composite structures in resonators where there are layers with opposite temperature coefficients. Document U.S. Pat. No. 4,719,383 discloses a shear wave resonator structure wherein a resonating beam has an obliquely grown piezoelectric layer and a p+ doped silicon layer. While the piezoelectric layer has a negative temperature coefficient, a heavily p+ doped silicon layer has a positive temperature coefficient. The thicknesses of the piezoelectric and doped silicon layers are made such that the total temperature coefficient of the resonator is near to zero.

There are certain disadvantages related with resonators of such composite structure as well. Firstly, the p+ doping of U.S. Pat. No. 4,719,383 is made by diffusion via the material surface. Diffusion is typically a slow process, and therefore the doped layer cannot be very thick. Increasing the thickness of the silicon layer would also cause the coupling of the actuation to be worse. As a result, since the resonance frequency is a function of the total thickness of the resonator structure it is only possible to provide resonators with high frequencies. The patent document mentions suitable frequencies above 300 MHz. However, there are numerous applications where lower resonance frequencies are required, for example in the range of 1-100 MHz, in particular 10-100

MHz, to be used for example as a reference frequency. The solution of U.S. Pat. No. 4,719,383 is not feasible for such lower resonance frequencies.

Another problem relating to the composite structure of U.S. Pat. No. 4,719,383 relates to the accuracy of the resonance frequency. In a thickness oriented shear wave resonator the resonance frequency is determined by the thickness of the resonator structure, and therefore an accurate resonance frequency requires achieving an accurate thickness of the resonator structure. However, it appears very difficult to achieve sufficient accuracy of the thickness, and therefore it is difficult to achieve the required accuracy of resonance frequency. In mass production, the deviation of resonance frequencies of such resonators tend to be high, and thus the yield of resonators which fulfill the required specifications tends to become low unless improved by local correction by e.g. ion beam etching, which, however, increases process complexity and cost substantially. A further problem which relates to the prior art MEMS resonators based on beam vibration is the fact that the small-size resonator beam has a small oscillating mass, and therefore the resonator is able to store only a small amount of oscillation energy. This in turn causes a low signal-to-noise ratio of the resonator and thus instability of the output signal frequency.

SUMMARY OF THE INVENTION

It is an aim of the invention to provide a novel resonator structure, in particular a silicon based resonator structure, by which at least some of the abovementioned problems can be avoided. The aim is achieved by providing a resonator array having the features of claim 1.

The invention is based on the idea that at least two resonator elements are simultaneously excited by using a piezoelectric transducer, which is arranged laterally with respect to the at least two resonator elements and between the at least two resonator elements. The transducer is adapted by suitable control to excite a resonance mode to the resonator elements, the resonance frequency of the resonance mode being dependent essentially only on the $c_{44}$ elastic parameter of the stiffness matrix of the resonator material, such as silicon.

According to one embodiment, the resonance mode is a Lamé mode. Preferably, the at least two resonator elements are individual square plates or square subplates which are part of larger resonator body. The piezoelectric transducer is coupled to the resonator elements at first lateral sides thereof and adapted to exert a force parallel to second, perpendicular lateral sides thereof.

According to another embodiment, the resonance mode is a Face-Shear mode. Preferably, the at least two resonator elements are individual square plates. The piezoelectric transducer is coupled to the resonator elements to or in the vicinity of their corners and adapted to exert a force parallel to the diagonals thereof.

According to still another embodiment, the resonance mode is a Wine glass mode. Preferably, the at least two resonator elements are individual disk-shaped, i.e. circular or elliptical.

Anchoring of the resonator elements to the substrate can be realized from nodal points of the resonance mode.

The piezoelectric transducer has preferably a silicon layer in common with the at least two resonator elements and being mechanically coupled to said resonator elements through a bridge in said layer. The transducer may be provided with a piezoelectric layer deposited or grown onto the silicon layer and electrode means coupled to the piezoelectric layer. For example, metal electrodes can be applied on both sides (top and bottom) of the piezoelectric layer. The silicon layer may also act as an electrode at least when doped so as to be electrically conductive.

The present methods of manufacturing a resonator and providing a frequency signal are characterized by the features of claim 25 and 26.

A further aim of the invention is to provide MEMS resonator structures which can be efficiently internally temperature compensated.

This aim is achieved by using a semiconductor layer which has been doped so as to bring its temperature coefficient of frequency (TCF) closer to zero than that of native semiconductor material concerned. For example, in the case of silicon, suitable doping can be achieved with boron, resulting in a p+-doped silicon crystal.

Further advantageous embodiments of the invention are the subject of the dependent claims.

Considerable advantages are obtained by means of the invention. By using a piezoelectrically actuated resonator whose resonance frequency is dependent only on the $c_{44}$ elastic parameter, the practical constraints with respect to bias voltage and gap size of electrostatic actuation are avoided. Also the resonator element as such can be kept simpler. Moreover, as anchoring of the resonator can be done from its nodal points, energy losses from the resonator to surrounding structures has been found to be low.

The whole resonator structure can be manufactured using existing semiconductor-on-insulator (SOI) processing technologies, including cavity-SOI (cSOI) and can be integrated to other SOI-devices.

Particular advantages as concerns versatility of resonator design are obtained if the resonance mode is a Lamé mode, as the resonator element may comprise a plurality of square subplates (virtual square Lamé resonators) that form a larger resonator body. Thus, various resonator geometries can be implemented.

It should be emphasized that excitation of the present $c_{44}$-only dependent mode is not possible with a piezoactive thin film that is grown on top of the resonator plate in such a way that the c-axis of the piezoelectric is perpendicular to the plane defined by the plate resonator. For example, in the case of a Lamé mode the fundamental reason for this is that the Lamé mode is a superposition of shear waves, and therefore each (infinitesimal) element within the resonator plate preserves its volume—as a result each surface area element preserves its area at all times. In a contradicting manner, piezoelectric effect within the piezo thin film would require area changes at the interface between the silicon resonator and the thin film. Due to this contradiction, electromechanical coupling to the Lamé mode does not occur. The invention solves this problem in an efficient manner.

It should be noted that there are also other plate resonator geometries and resonance modes that share similar characteristics to the square-shaped plate resonator operating in the Lamé mode. To summarize, these characteristics common to these modes and geometries are:

The resonance is based on bulk acoustic shear waves within the resonator.

When the resonator is formed of single crystalline silicon, the resonance frequency is dependent essentially only on the $c_{44}$ stiffness matrix element (i.e., not on the other two independent stiffness matrix elements $c_{11}$ and $c_{12}$), when the resonator body is correctly aligned with the crystal directions.

The resonance mode is locally volume preserving, and, therefore, cannot be electrically excited using a thin film grown on top of the resonator. However, the invented transduction method of laterally arranged arrays of resonators and interposed piezotransducer blocks is applicable for achieving proper electromechanical coupling.

The frequency of the present resonator is inversely proportional to the side length L or diameter D of the resonator elements. The form and size of the resonator element can be defined with lithography, and therefore the dimensions can be made very accurate. Thus, the resonating frequency can also be made very accurate. The frequency range of the present resonator can be designed to be suitable (e.g. 5-150 MHz) for many practical applications. Very importantly, it is possible to produce a resonator component of very small thickness (<300 µm) oscillating at a frequency range below 150 MHz.

In a square plate resonating in Lamé or Face-Shear mode or a disk resonating in Wine glass mode, the vibrating mass is relatively large, whereby the resonator can provide a high signal-to-noise value. Frequency instability due to frequency noise is therefore small.

The invention can be used for replacing presently used quartz crystal oscillators and temperature compensated crystal oscillator (XO/TCXO) oscillators in various devices. In addition, the invention can be used as a temperature compensated frequency synthesizer in combination with integrated circuitry for oscillator/frequency generation.

Using a heavily p-doped silicon crystal, the temperature dependence of the Lamé mode of a square shaped silicon resonator can be reduced to less than −3 ppm/C and even better.

The expression that the resonance frequency is "dependent essentially only on the $c_{44}$ elastic parameter" means that the frequency does not significantly depend on other elastic parameters of the resonator material, such as $c_{11}$ and $c_{12}$ in the case of silicon. In particular, the contribution of non-$c_{44}$ elastic parameters to the resonance frequency must be 5% at maximum. This is discussed later in more detail.

Next, embodiments of the invention will be described in more detail with reference to the attached drawings.

DETAILED DESCRIPTION OF EMBODIMENTS

Figure 1A:
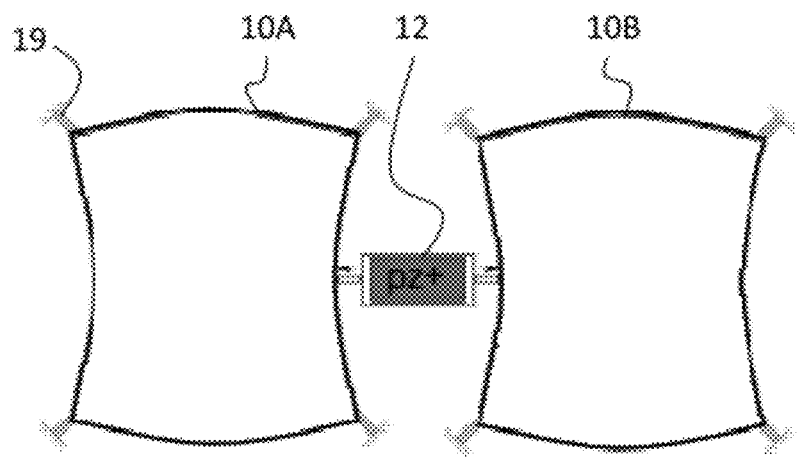
FIG. 1a shows in top view the principle of a piezoactuated Lame mode resonator comprising two resonating plates.

The invention is now described in more detail having particular focus on Lamé mode resonators and shortly introducing other preferred modes too. However, first the concept of $c_{44}$ dependency of silicon and particular advantages of the invention with respect to temperature compensation are described in more detail.

$c_{44}$ Dependent Resonance Modes

The resonance frequency of a mode of a resonator having an arbitrary shape is, in a general form, given by $$f = A \frac{1}{L} \sqrt{\frac{c}{\rho}}, \quad \text{(Eq. A)}$$

where c is a generalized elastic modulus of the material, $\rho$ is the material density, and L is a generalized dimension of the resonator. For single crystal silicon, the elastic properties are given by three independent elastic parameters $c_{11}$, $c_{12}$ and $c_{44}$, and the generalized elastic modulus c is a function of the three elastic parameters $$c = c(c_{11}, c_{12}, c_{44}). \quad \text{(Eq. B)}$$

Importantly, constant A depends on the resonator geometry, on the resonator relative orientation with the silicon crystal axes, and on the particular resonance mode under investigation.

For silicon, the elastic parameters are strongly temperature dependent (typically approximately −60 ppm/° C.). As a result, the resonance frequency changes with temperature (a minor contribution comes from thermal expansion, which affect both L and ρ). It has been found that the thermal dependency of $c_{44}$ can be reduced by heavily p-doping silicon with boron, i.e., $\partial c_{44}/\partial T$ gets very small compared to its original value with heavy concentration of boron. It has been also observed that $c_{11}$ and $C_{12}$ are less modified with boron doping.

To take full advantage of the above described phenomenon for the temperature compensation of a single crystal resonator, the resonance mode should be dependent only on $c_{44}$:

$$\partial f/\partial c_{11}=0, \partial f/\partial c_{12}=0 \text{ and } \partial f/\partial c_{44}\neq 0. \quad \text{(Eq. C)}$$

Such modes are, for example, the Lamé and Face-Shear modes of a square plate resonator and wine-glass mode of a disk shaped plate resonator. In all these cases, the alignment of the resonator with the crystal directions has to be suitably chosen.

In reality, due to design compromises and imperfect fabrication, there will always be some contribution from non-$c_{44}$ parameters too. However, it is preferred within this invention that:

$$|\partial f/\partial c_{11}|<0.20\times|\partial f/\partial c_{44}|$$

and $$|\partial f/\partial c_{12}|<0.20\times|\partial f/\partial c_{44}|$$

Thus, in general, a maximum of 20% contribution to the resonance frequency is allowed from each non-$c_{44}$ component. Designs with non-$c_{44}$ contributions of less than 10% and even less than 5% can, however, be feasibly implemented An example of a design compromise is the inclusion of the piezoelectric transduction block between the laterally arranged resonators: The transduction block's deformation is extensional (i.e., contains no shear components), and therefore results in non-$c_{44}$ contribution of the compound resonator frequency. An example of imperfect fabrication is crystal direction misalignment with the resonator.

Lamé Mode

As shortly explained above, the invention can be implemented by coupling two or more Lamé resonators together by one or more separate, laterally positioned piezotransducer blocks. The proposed principle can be used with plain (non-compensated) silicon resonators but, even more importantly, enables the utilization of TCF compensation property of the Lamé mode.

Some examples of practical structures are explained below.

With reference to FIG. 1a, in its simplest form the design consists of two square resonator plates 10A, 10B, and between them there is a piezotransducer 12 coupled from opposite lateral sides thereof to the resonator plates 10A, 10B. Extension and contraction of the piezotransducer 12 is coupled to the resonator plates 10A, 10B and can be used to drive the plates into the desired Lamé mode. The resonator plates 10A, 10B are, from lateral side thereof separated from surrounding structures, apart from anchors 19 on corners thereof.

Figure 1B:
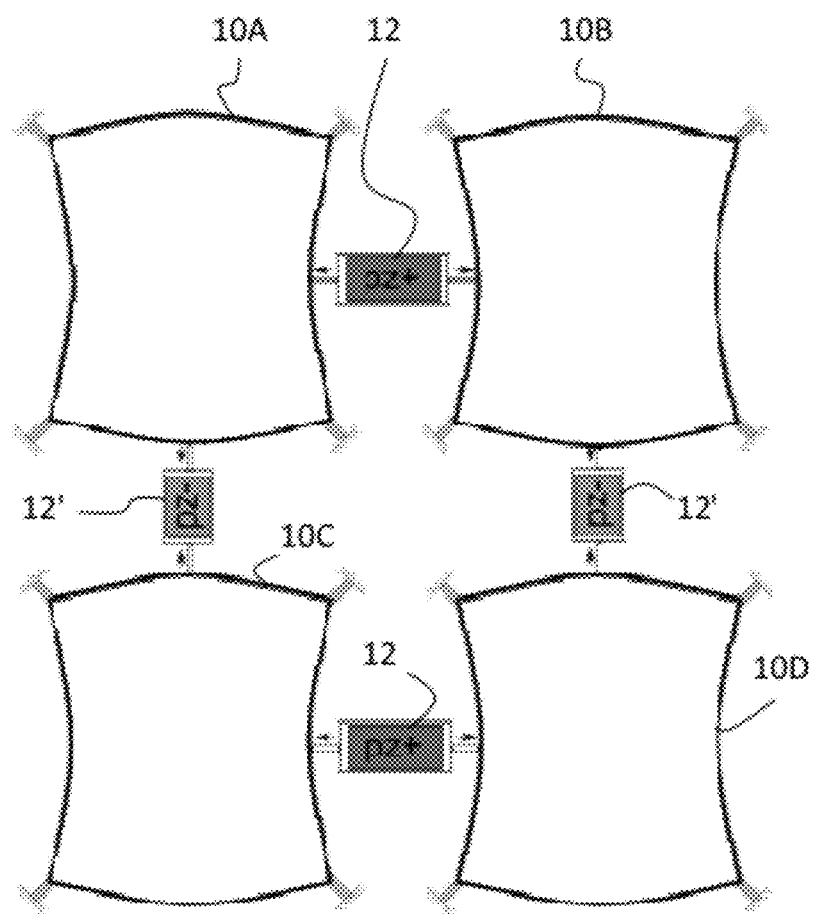
FIG. 1b shows in top view one embodiment of a piezoactuated Lame mode resonator comprising four resonating plates.

FIG. 1b shows a four-plate square resonator structure in which two first piezotransducers 12 operating in first phase are provided in parallel between first pairs 10A, 10B and 10C, 10D of resonator plates respectively. In addition, two second piezotransducers 12' operating in second phase, which is 180° shifted from the first phase, are provided perpendicularly to the first piezotransducers 12 between second pairs 10A, 10C and 10B, 10D or resonator plates. Thus, the polarity of operation and orientation of the piezotransducers is selected depending on their positioning in the array. The piezotransducers may act as sense or drive elements.

The resonator elements are preferably square plates. Their side length can be for example 100-1000 µm. A typical side length is 320 µm. The thickness of the resonator element can be for example 5-100 µm. A typical thickness is 30 µm.

According to a preferred embodiment, the resonator elements and the piezoelectric transducer element between them comprise a common semiconductor layer, such as a silicon layer. Common layer means in particular that the resonator elements and at least one layer of the piezotransducer are processed from the same layer of a SOI wafer (device layer).

Figure 2A:
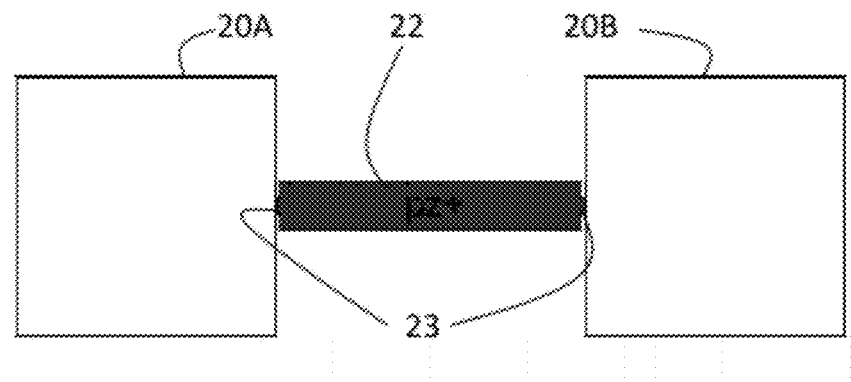
FIG. 2a shows an example of the design of the piezotransducer placed between two resonator elements.

Referring now to FIG. 2a the piezoelectric transducer element 22 is mechanically coupled to the resonator elements 20A, 20B through unitary bridges 23 of the device layer between the piezoelectric transducer element and the resonator elements 20A, 20B. The bridges 23 are preferably narrow, their width being preferably less than 10%, in particular less than 5% of the side length of the resonator elements 20A, 20B. For maximal energy transfer from the transducer to the resonator element 20A, 20B, the bridges 23 at both ends of the piezotransducer are positioned in the middle of the side of the respective resonator elements 20A, 20B. Alternatively to positioning the piezotransducer exactly in the middle of the side, it may be positioned on another location along the side, preferably dislocated from the middle point no more than 20% of the side length. However, on some situations, it would be preferable to position the piezotransducer closer to the anchor points to reduce the coupling of the transducers to the resonator elements.

Figure 2B:
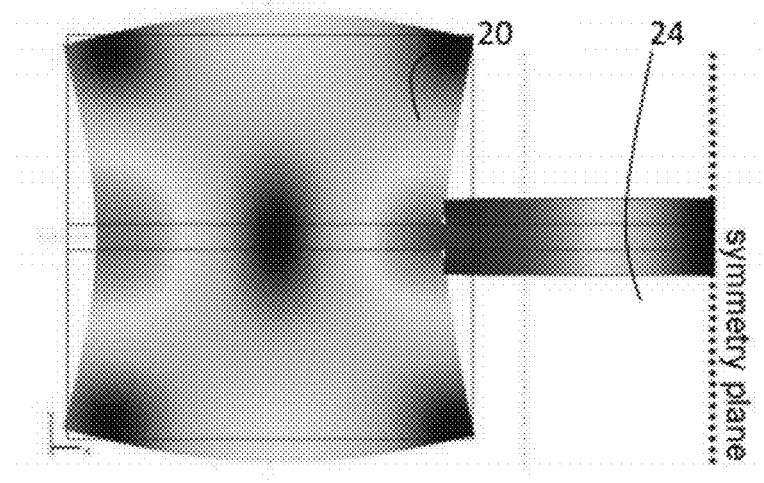
FIG. 2b shows the FEM-calculated Lamé mode shape in a square plate resonator.
Figures 3A, 3B, 3C, 3D:
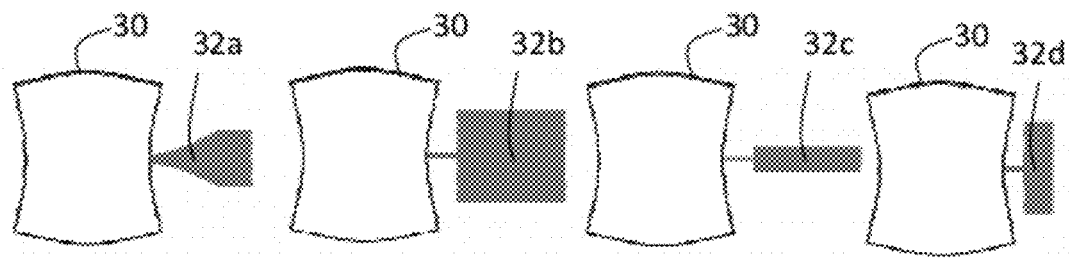
FIGS. 3a-3d show different possible shapes of a piezotransducer.

FIG. 2b shows a finite element model (FEM) calculation of a Lamé resonance mode in a 320×320 µm$^2$ resonator plate. It can be seen that the nodal points are close to the corners and in the middle of the resonator. The small shift of the nodal points from the corners, as compared to the mode shape of the Lamé mode of an isolated single plate, occurs due to the small disturbance of the transducer that is attached to the resonator plate.

Figure 4A:
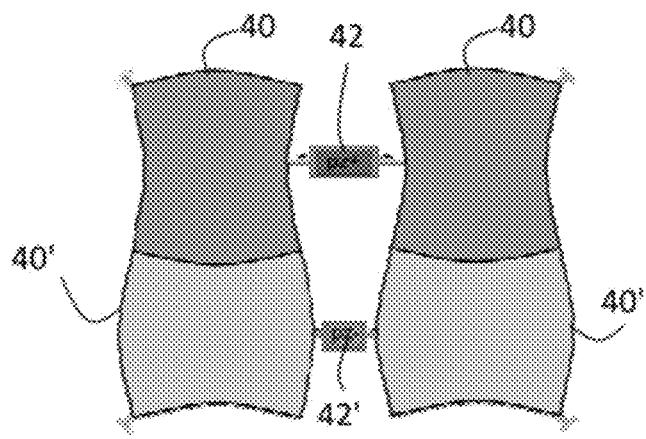
FIGS. 4a-4e show in top views schematic designs of different piezoactuated Lame mode resonator structures.
Figure 4B:
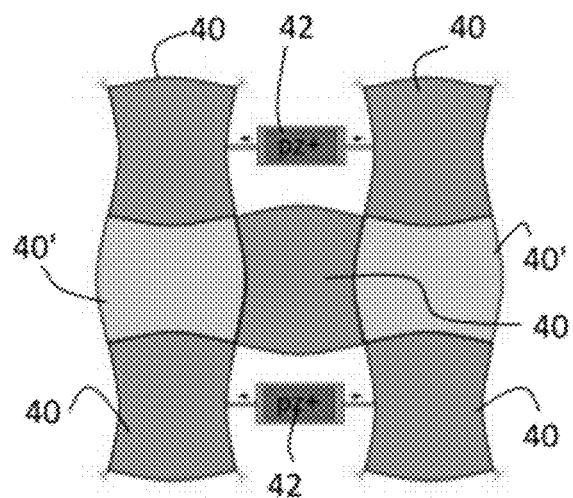
Figure 4C:
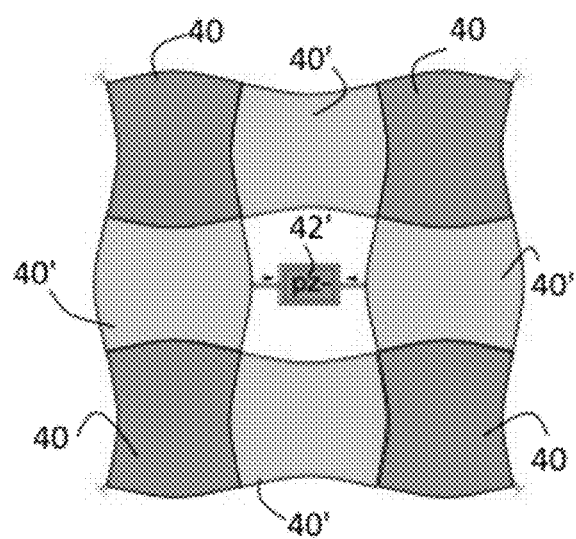
Figure 4D:
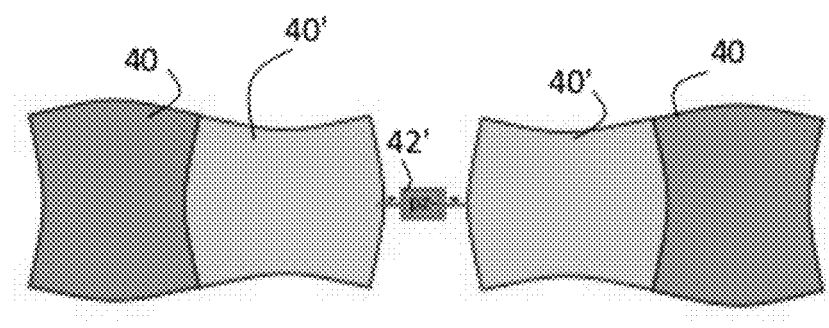
Figure 4E:
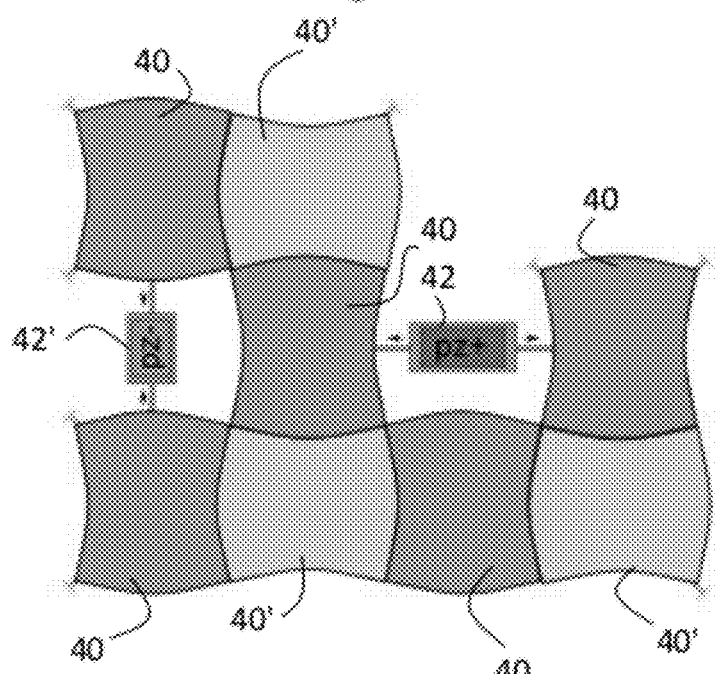
Figure 5A:
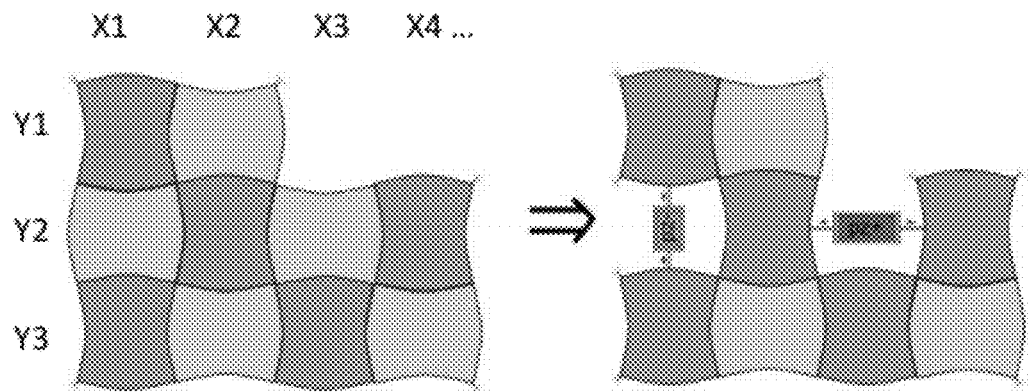
FIG. 5a illustrates a procedure for accommodating an exemplary Lamé resonator geometry for piezodrive.
Figure 5B:
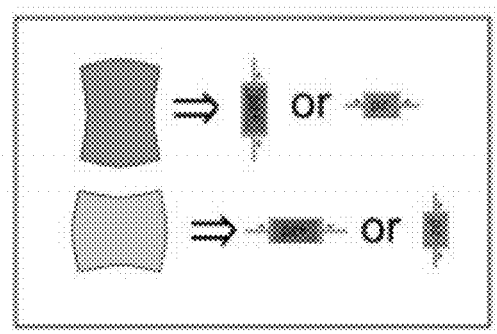
FIG. 5b illustrates general rules for accommodating an arbitrary Lamé resonator geometry for piezodrive.

The abovementioned examples explained with reference to FIGS. 1a and 1b can be generalized for any resonator geometry that is divisible into subsquares of identical shape, with an arbitrary number of subsquares replaced by piezotransducer blocks with correct polarity. FIGS. 5a and 5b illustrate this principle and FIGS. 4a-4c show practical examples. Referring first to FIG. 5a, there is shown resonator plate divided into a matrix of subplates. Thus, each subplate Xn/Ym (n,m=1, 2, 3 . . . ) between other subplates can be replaced by suitably phased and oriented piezotransducer block as shown in FIG. 5b.

It should be noted that the subplates act as the resonator elements within the meaning of the invention. The division can be virtual only, which is useful for characterizing and designing higher-order harmonic modes excitable into plates having an arbitrary shape.

In FIGS. 4a-4e the resonator subplates are denoted with numerals 40 and 40', depending on their phase of resonance (180° shift). The piezotransducers are correspondingly denoted with numerals 42 and 42'.

On the basis of the above examples it can be understood that the array may comprise a two-dimensional matrix of resonator elements of almost any shape. There may be one, or more piezoelectric transducer elements arranged between the resonator elements and adapted to oscillate in the same phase or 180 degrees out-of-phase, depending on their location in the matrix.

According to one embodiment, the array comprises at least two piezoelectric transducer elements which are arranged to oscillate in the same direction, like shown in FIGS. 4a and 4b. According to one embodiment, the array comprises at least two piezoelectric transducer elements which are arranged to oscillate in perpendicular directions, like shown in FIG. 4e.

Figure 6:
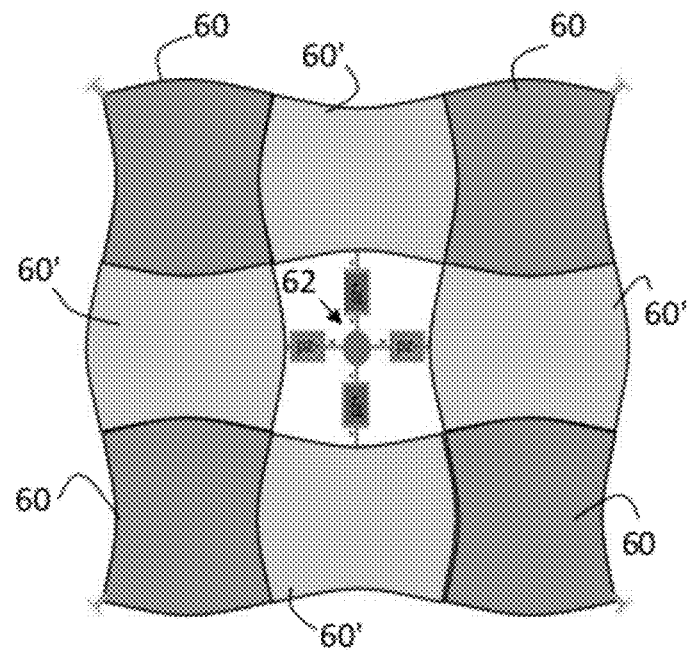
FIG. 6 shows a special piezoactuated Lamé mode resonator array geometry.

FIG. 6 shows a special geometry of a rectangular resonator plate which has been divided into 9 subplates 60, 60'. The central plate has been replaced by a special transducer block 62. The special transducer block comprises a central element, acting as a common point and four piezotransducers attached from first ends thereof to this common point and from second ends thereof to the four neighboring subplates 40'. The central element may or may not be anchored to the substrate. Alternatively, the piezotransducers are directly attached to each other at the common point. The polarities of the piezotransducers in different orientations differ. Using such configuration, a Lamé mode can be conveniently excited from a single symmetry point, which reduces the amount or required wiring or conductors in the structure. It must be noted that this embodiment falls within the scope of the present invention, because there is at least one piezoelectric transducer element arranged laterally with respect to at least two resonator elements between the at least two resonator elements and adapted to excite a Lamé resonance mode in the resonator elements. Thus, this embodiment falls within the scope of the invention. Generally speaking, the array may comprise at least two, preferably four, piezoelectric transducer elements anchored on one sides thereof to an anchoring point within the array and on other sides thereof to different resonator elements. The anchoring point may be static (integral) with respect to the substrate or non-static (floating).

The Lamé mode excited to the resonator is based on shear waves and it may be of the first or any higher order. The first order mode is comprised of two diagonally propagating shear waves in a square plate. In higher order modes this condition is satisfied in each subplate. To achieve the best performance, i.e. to keep losses at minimum, and to obtain maximum benefit of temperature compensation achieved by doping, if applicable, the mode excited to the resonator elements should be essentially dependent only on the $c_{44}$ term of silicon elastic matrix elements. Due to nonidealities in the system, such as anchoring and manufacturing tolerances, small but practically negligible effect of elastic terms $c_{11}$ or $c_{12}$ may also be observed.

Generally speaking, a Lamé mode can occur in a square shaped resonator for some crystal cuts, i.e., for a certain combination of wafer plane and orientation of the plate within that plane. The lame mode frequency is given in a generalized form as $$f = \frac{1}{\sqrt{2}L}\sqrt{\frac{c_{xy,shear}}{\rho}} \quad \text{(Eq. 1)}$$

where $c_{xy,shear}$ denotes the elastic matrix in-plane shear component, $\rho$ is the material density, and sqrt(2)L is the length of the plate diagonal.

Two important Lamé mode cases, in particular, are within the scope of the invention:

The first case comprises
- a (100) silicon wafer, plate sides oriented along the <110> directions, and
- a (110) silicon wafer, one plate diagonal oriented along <110> direction and the other one along <100>.

In these cases, the shear term is determined by single elastic matrix element c44, and Eq. 1 can be written as $$f = \frac{1}{\sqrt{2}L}\sqrt{\frac{c_{44}}{\rho}}. \quad \text{(Eq. 2)}$$

The second case comprises
- a (100) silicon wafer, plate sides oriented along the <100> directions.

For this cut we obtain c $C_{xy,shear}=(c_{11}-c_{12})/2$, and the resonance frequency is given by $$f = \frac{1}{2L}\sqrt{\frac{c_{11}-c_{12}}{\rho}} \quad \text{(Eq. 3)}$$

The above modes can be characterized as "pure-shear" or volume-preserving modes.

Also higher order Lamé modes may take place in the plate. Generally speaking, a higher-order Lamé mode can occur in a rectangular plate whose side length ratio is a rational number (i.e., the width and the height are integer ratioed). Examples of such higher-order modes are shown in FIG. 4a-4e. Assume that the rectangular plate has height h and width w, and that $N_h$ and $N_w$ denote the terms of the side length ratio $$r = \frac{N_h}{N_w}, \quad \text{(Eq. 4)}$$

when the ratio is reduced to its lowest common terms. The formula for the Lamé mode frequencies, including the higher mode frequencies, is now given by $$f = n \times N_h \frac{1}{\sqrt{2}h}\sqrt{\frac{c_{xy,shear}}{\rho}} \quad \text{(Eq. 5)}$$
$$= n \times N_w \frac{1}{\sqrt{2}w}\sqrt{\frac{c_{xy,shear}}{\rho}},$$
$$n = 1, 2, 3, \ldots$$

Figures 11A, 11B, 11C:
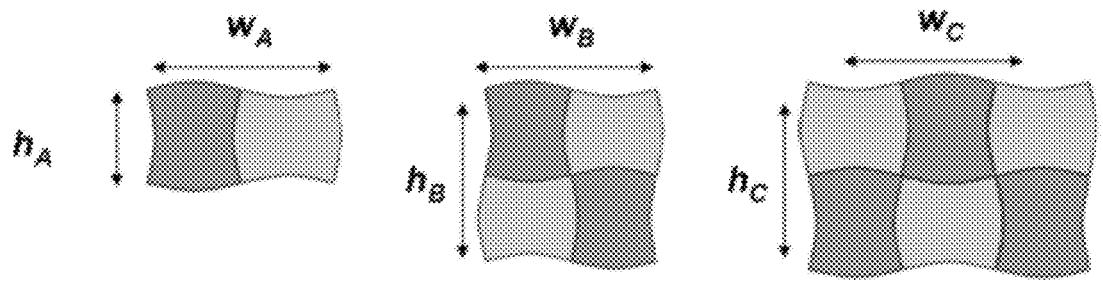
FIGS. 11a-11c show higher-order Lamé resonators.

For resonator of FIG. 11a we obtain h:w=1:2, and $$f = n \times \frac{1}{\sqrt{2}h}\sqrt{\frac{c_{xy,shear}}{\rho}} = n \times 2\frac{1}{\sqrt{2}w}\sqrt{\frac{c_{xy,shear}}{\rho}} \quad \text{(Eq. 6)}$$

For the modeshape in FIG. 11a we have n=1.
For resonator of FIG. 11b we obtain h:w=1:1, and $$f = n \times \frac{1}{\sqrt{2}h}\sqrt{\frac{c_{xy,shear}}{\rho}} = n \times 2\frac{1}{\sqrt{2}w}\sqrt{\frac{c_{xy,shear}}{\rho}}. \quad \text{(Eq. 7)}$$

For the modeshape in FIG. 11b we have n=2.
For resonator of FIG. 11c we obtain h:w=2:3, and $$f = n \times 2\frac{1}{\sqrt{2}h}\sqrt{\frac{c_{xy,shear}}{\rho}} = n \times 3\frac{1}{\sqrt{2}w}\sqrt{\frac{c_{xy,shear}}{\rho}}. \quad \text{(Eq. 8)}$$

Figure 12:
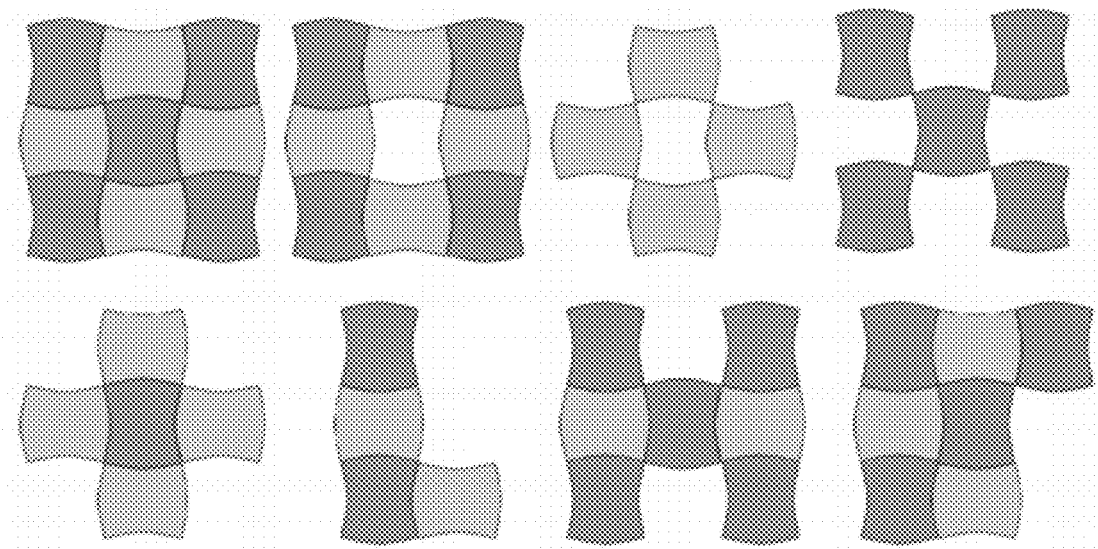
FIG. 12 shows irregular Lamé resonators.

For the modeshape in FIG. 11c we have n=1. FIG. 12 shows examples of resonator geometries, which consist of combinations of the basic square-plate unit (a virtual square Lamé resonator). Such resonator geometries are within the scope of the invention. A formula like Eq. (5) cannot be given for the resonance frequency of these structures, since the general geometry is arbitrary. Instead, the frequency of the compound resonator is exactly that of the frequency of the basic building block given by Eq. (1).

Figure 10A:
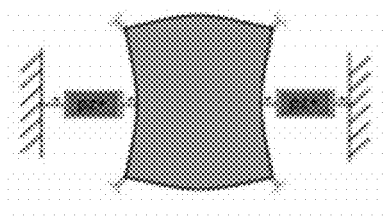
FIGS. 10a and 10b show theoretically possible but practically inferior piezotransduction configurations.
Figure 10B:
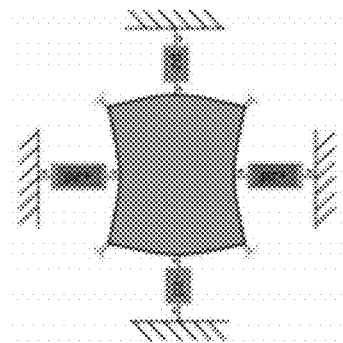

Finally, it should be noted that the configurations shown in FIGS. 10a and 10b, although theoretically possible, would not result in good resonator structures in practice since the piezotransducers would act as anchors that are attached at anti-nodal points with respect to the resonance mode shape. Therefore, energy would be transferred to the surrounding structures and the resonators would have low Q-values. The present solution, in which each piezotransducer is positioned between two identical square resonator elements, poses no such problem to anchoring. The Lamé resonance modeshape of the resonator elements is negligibly altered by the inclusion of the piezotransducer and the plate anchors are only at nodal points (corners) of the elements.

Temperature Compensation

Turning now to temperature compensation of the resonator, the resonator elements may be manufactured from a doped, preferably p+-doped, in particular boron-doped semiconductor layer, in particular a silicon layer. This reduces the TCF of the resonator significantly. Preferably the semiconductor layer of the transducer(s) also is a similarly doped layer.

The doping concentration in said semiconductor layer is preferably such that the TCF of the resonance frequency of the plate is smaller in magnitude than 20 ppm/K, preferably smaller in magnitude than 10 ppm/K. TCF's of smaller in magnitude than 3 ppm/K have been found to be possible.

According to a preferable embodiment device layer is silicon which is heavily boron doped, the doping concentration typically being at least $10^{19}$ cm$^{-3}$, in particular $3*10^{19}$-$3*10^{20}$ cm$^{-3}$. The layer may also be doped with germanium in order to reduce tensile stress which is caused by the p+ doping. The inventors of the present patent application have discovered that the doping with germanium also has an effect of reducing the second order temperature coefficient of the material compared to material with merely boron doping. This can be a significant feature in order to achieve accurate temperature compensation within a large temperature range.

It should be noted that in addition to the basic silicon material of the plate, the resonator may include also other structures which may have a negative temperature coefficient. Therefore, it is preferable to obtain by doping and possibly other means such compensation to the temperature coefficient of the resonator plate that the total temperature coefficient of the resonance frequency of the resonator is close to zero. This may mean that the temperature coefficient of a separate resonator plate without other resonator structures would be slightly positive.

The temperature compensation of the resonator is preferably entirely passive, meaning that it is based on material and structural properties rather than feeding additional energy to the system to compensate for the temperature drift.

According to one embodiment the plate has a layer of silicon dioxide. A silicon dioxide layer has a positive temperature coefficient, whereby it is possible to increase the absolute value of the temperature coefficient of the resonance plate if the effect of the p+ doping is not sufficient for any reason.

Figure 9A:
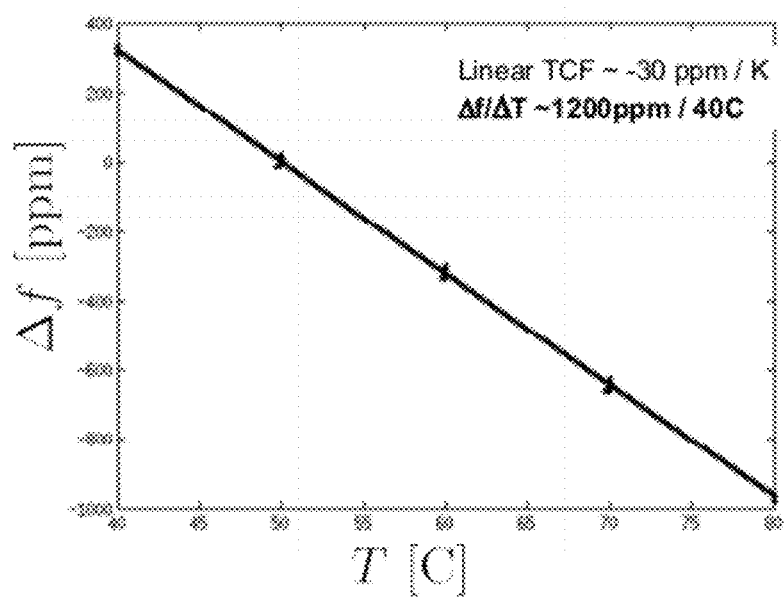
FIGS. 9a and 9b shows a typical temperature vs. frequency dependency of a pure silicon resonator and reduced temperature vs. frequency dependency of a strongly B-doped resonator, respectively.
Figure 9B:
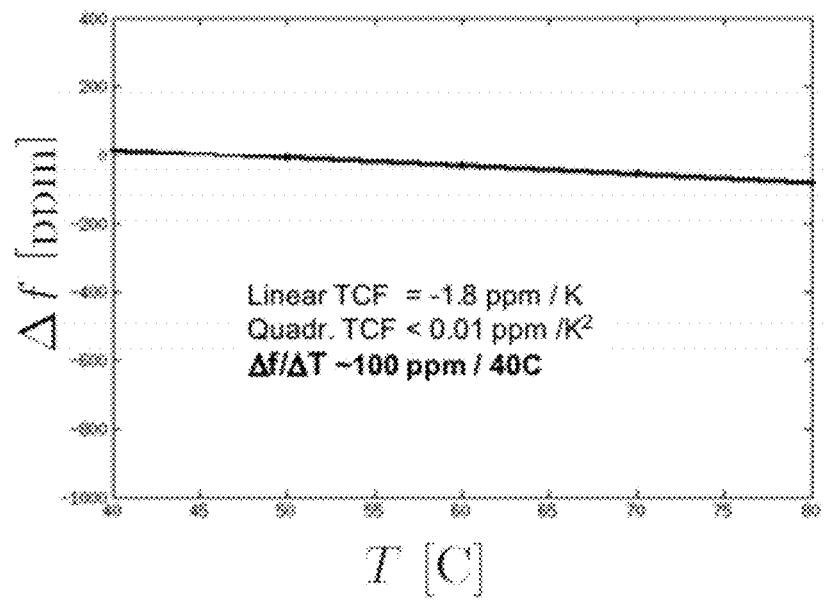

FIGS. 9a and 9b show temperature vs. frequency curves of a pure silicon and boron-doped silicon resonators. It can be seen, that the linear TCF of −30 ppm/K of the former has reduced to −1.8 ppm/K of the latter. This represents a huge improvement of the resonator for practical implementations.

Alternative Modeshapes

Figure 13A:
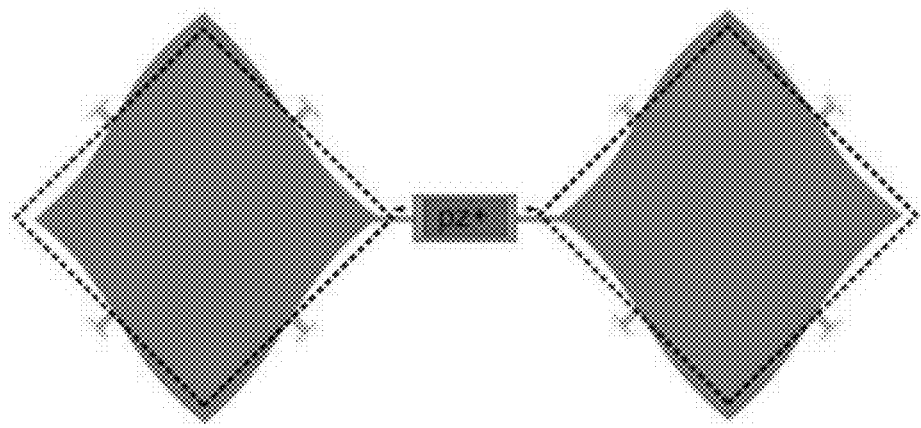
FIGS. 13a and 13b show to alternative resonator geometries according to further embodiments (Face-Shear and Wine glass modes, respectively) of the invention.
Figure 13B:
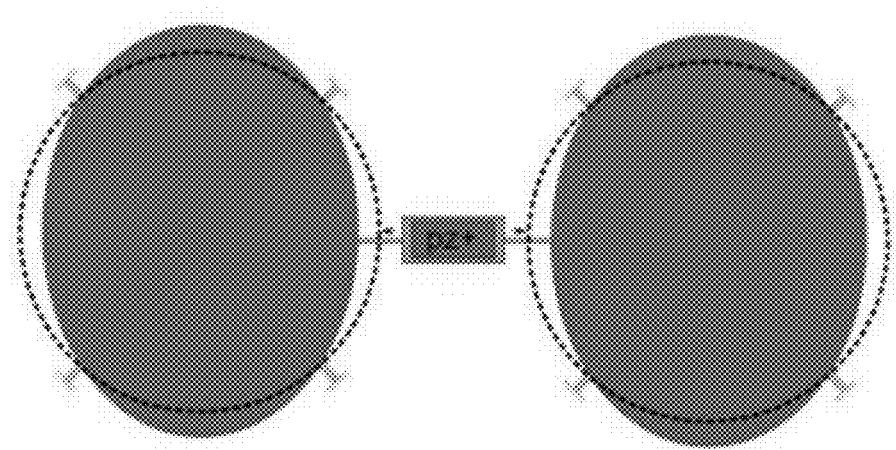

FIGS. 13a and 13b show resonator structures and modeshapes according to further embodiments of the invention.

In the example of FIG. 13a (Face-Shear mode of a square-shaped plate resonator), the resonator plates are coupled to the piezotransducer between them from their corners and anchored to the substrate from their sides. Thus, the resonator plates are square plates shaped as diamonds and adapted to resonate in shear mode reminiscent of a Lamé mode. The dashed lines depict a non-deformed shape whereas the solid grey area depicts the Face-Shear mode shape. The Face-Shear mode shape is such that low loss anchoring at the midpoints of each side is possible. Resonators of this type are discussed by Angel T-H Lin, Jize Yan, and Ashwin A. Seshia, "*Electrostatically Transduced Face-Shear Mode Silicon MEMS Micro resonator,*" in *IEEE International Frequency Control Symposium* (Newport Beach, 2010), 534-538.

The resonance frequency of a face shear mode of a square-shaped plate resonator is (only) $c_{44}$-dependent at least in the following cases:
- (100) silicon wafer, plate sides oriented along the <100> directions, and
- (110) silicon wafer, one plate side oriented along <110> and the other side along <100>.

In the example of FIG. 13b (Wine glass mode), the resonator plates are circular. The piezotransducer is coupled to the resonator plates so as to exert a force at 45° angle with respect to the directions defined by pairs of opposite anchors positioned symmetrically around the plate. Resonators of this type are discussed by M. A Abdelmoneum, M. U Demirci, and C. T. C. Nguyen, "*Stemless wine-glass-mode disk micromechanical resonators,*" in *IEEE The Sixteenth Annual International Conference on Micro Electro Mechanical Systems,* 2003. MEMS-03 Kyoto, 2003, 698-701.

The Wine glass mode of the disk-shaped plate resonator has four nodal points at the disk perimeter. These nodal points divide the disk perimeter to four equal portions. Low loss anchoring at the nodal points is straightforward.

The resonance frequency of a Wine glass mode of a disk-shaped plate resonator is (only) $c_{44}$-dependent at least in the following cases:
- (100) silicon wafer, (virtual) lines connecting the anchors at opposite sides of the disk are oriented along the <100> directions
- (110) silicon wafer, one (virtual) line connecting the anchors at opposite sides is oriented along <110> direction, and the other such line is oriented along <100>.

It is not possible to form higher-order modes or divide a complex geometry into subplates that would resonate in the Face-Shear mode or Wineglass mode in the manner as can be done for Lamé plates as discussed above. However, it should be noted that resonator plates according to FIGS. 13a and 13b can be combined to form two-dimensional resonator arrays, for example, similarly to as shown in FIG. 1b with Lamé plates.

Piezotransducers

Figure 8:
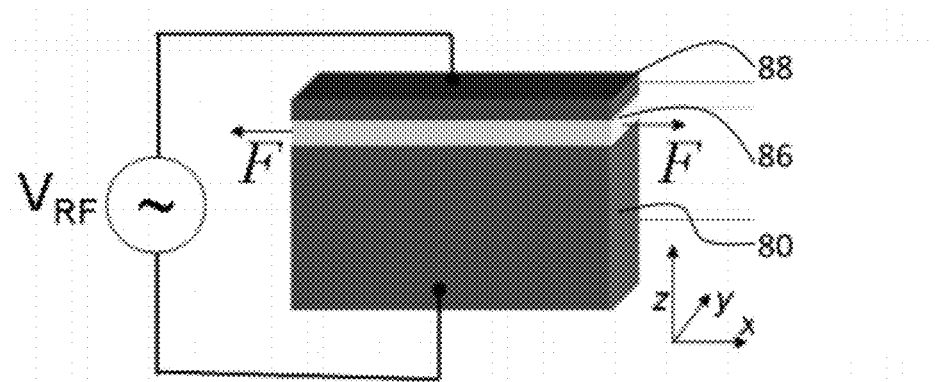
FIG. 8 shows an exemplary layer structure of a piezotransducer in perspective view.

With reference to FIG. 8, the piezotransducer may comprise body 80 of silicon, on top of which a layer 86 of piezoelectric material, such as AlN, ZnO, or PZT, has been grown. On top of the piezoelectric layer 86, an electrode layer 88 is provided. In this structure, the silicon body 80 acts as one electrode and the electrode layer 88 as the other electrode. The potential difference between the electrodes forms a z-directed electric field with the piezoelectric thin film. This electric field creates x- and y-directed forces through the piezo cross coupling coefficient $e_{31}$ and through the $e_{33}$ piezoelectric coefficient (indirectly due to the Poisson effect), and these forces result in lateral deformation of the underlying silicon layer. This kind of piezotransducer acts as an efficient piezoelectric transducer that subjects an oscillating force to a resonator plate mechanically coupled with it and thus drives the Lamé resonance of the plates. The silicon body 80 of the piezotransducer may be also doped so as to have a low TCF, similarly to the resonator plates.

Alternatively to the configuration shown in FIG. 8, The piezotransducer may comprise two metal electrodes arranged on different sides of the piezoelectric layer. Thus, it is not necessary to use the silicon layer as an electrode.

FIGS. 3a-3d show different possible shapes of piezotransducers and their couplings to the resonator elements (only one half of a two-element array shown, the symmetry plane being located in upright orientation on the right hand side of the figures).

As understood by a person skilled in the art, the piezotransducer can act as a drive block, which means that when a positive/negative voltage is applied across the piezoactive layer, a stretching/contractive force is exerted to the resonator plate. Alternatively, a piezotransducer can have a role of a sense block, which means that if the piezoactive layer is stretched/contracted by external forces, positive/negative charge is accumulated at the top electrode (negative/positive charge on the bottom electrode, respectively). There may be provided one or more piezotransducers of either purpose in the device separately or simultaneously, depending on its intended use. Moreover, when the resonator is electrically connected as a 1-port device, one piezotransducer can act as a drive block and as sense block simultaneously.

Method of Manufacturing

The present resonator structure can generally be manufactured by
- providing a semiconductor wafer having a device layer, separated by an insulating layers such as silicon oxide
- forming from said device layer at least two resonator elements so that the resonator elements are located laterally with respect to each other as an array,
- forming from the device layer at least one transducer element portion located laterally with respect to the resonator elements and mechanically coupled to said resonator elements,
- providing a piezoelectric layer on top of said transducer element portion, and
- forming an electrical contact to said piezoelectric layer so as to form a transducer element capable of piezoelectrically exciting a Lamé resonance mode in the resonator elements.

Figure 7A:
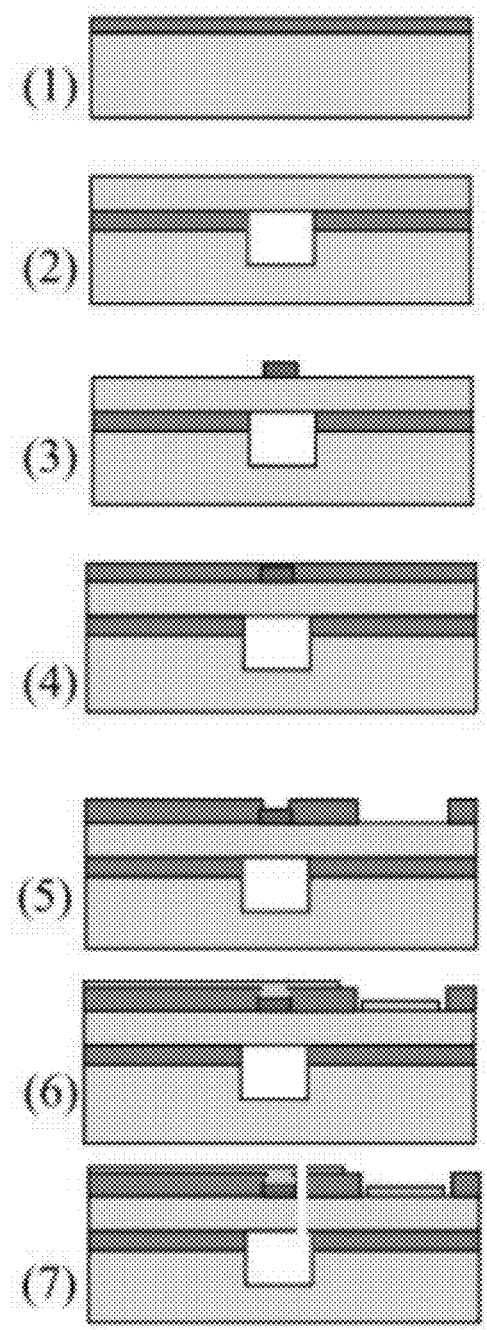
FIGS. 7a and 7b illustrate different SOI processing techniques for manufacturing a piezoactuated Lamé mode resonator according to the invention.
Figure 7B:
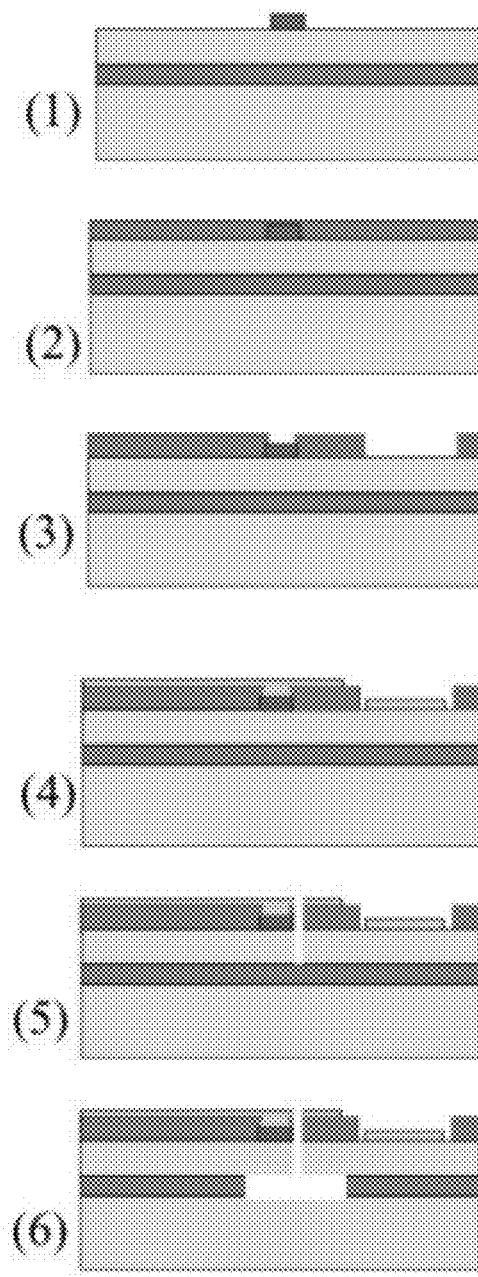

FIGS. 7a and 7b illustrate in more detail cavity-SOI (cSOI) and normal-SOI processes for manufacturing a resonator structure of the present kind. In these examples, the SOI wafer is a Si—SiO$_2$-(doped)Si wafer. The cSOI process comprises
(1) providing an oxidized silicon wafer comprising a first silicon layer (handling layer) and a first oxide layer,
(2) manufacturing a cavity into the first silicon layer through the first oxide layer and providing a second silicon layer (device layer) onto the first oxide layer,
(3) providing a piezoactive layer (e.g. AlN) onto the second silicon layer aligned with the cavity,
(4) oxidizing or depositing an oxide layer on the free surface of the upper silicon layer to provide a second oxide layer,
(5) locally removing the second oxide layer to locally expose the second silicon layer, and in the case of deposited oxide, to expose also the piezoactive layer
(6) providing electrical conductors (e.g. Mo) on top of the second oxide layer to the piezoactive layer and to the exposed second silicon layer in order to be able to conduct electric potential through the piezoactive layer,
(7) etching vertical trenches to the structure so as to separate the resonator element and piezotransducers suitably from each other and from surrounding structures, as described above, leaving only the so called anchors to support the resonator element.

The normal-SOI process comprises
(1) providing a SOI wafer comprising a first silicon layer (handling layer), a first oxide layer and a second silicon layer (device layer), and providing a providing a local piezoactive layer (e.g. AlN) onto the second silicon layer,
(2) oxidizing or depositing an oxide layer on the free surface of the upper silicon layer to provide a second oxide layer,
(3) locally removing the second oxide layer to locally expose the second silicon layer, and in the case of deposited oxide, to expose also the piezoactive layer,
(4) providing electrical conductors (e.g. Mo) on top of the second oxide layer to the piezoactive layer and to the exposed second silicon layer in order to be able to apply electric potential over the piezoactive layer,
(5) etching vertical trenches to the structure so as to separate the resonator element and piezotransducers from surrounding structures, leaving only the so called anchors to support the resonator element,
(6) etching horizontal cavities to the first oxide layer so as to separate the second silicon layer suitably from the first silicon layer.

In FIGS. 7a and 7b, the trenches (release etching) are illustrated on the right hand side of the piezotransducer and cavity, whereas the structure at the location of anchors (non-releasing) is illustrated on the left hand side of the piezoactive layer and cavity.

The device layer may be doped as described above, for example with boron. either prior to providing the device layer on to the substrate or afterwards by adding a process step for that purpose.

After SOI processing, the resonator structure is preferably vacuum encapsulated.

The invention claimed is:

1. A microelectromechanical resonator array comprising
   at least two resonator elements made from semiconductor material, the resonator elements being arranged laterally with respect to each other as an array,
   at least one transducer element coupled to said resonator elements and capable of exciting a resonance mode to the resonator elements,
   wherein
   said at least one transducer element is a piezoelectric transducer element arranged laterally with respect to the at least two resonator elements between the at least two resonator elements and adapted to excite to the resonator elements as said resonance mode a resonance mode whose resonance frequency is dependent essentially only on the $c_{44}$ elastic parameter of the elastic modulus of the material of the resonator elements.

2. The resonator array according to claim 1, wherein said resonance mode is a Lamé mode.

3. The resonator array according to claim 2, wherein the resonator elements comprise
   square plates made from a (100) silicon wafer, plate sides being oriented along the <110> directions,
   square plates made from a (110) silicon wafer, one plate diagonal being oriented along <110> direction and the other one along <100>, or
   square plates made from a (100) silicon wafer, plate sides being oriented along the <100> directions.

4. The resonator array according to claim 1, wherein said resonance mode is a Face-Shear mode.

5. The resonator array according to claim 4, wherein the resonator elements comprise
   square plates made from (100) silicon wafer, plate sides oriented along the <100> directions, or
   square plates made from (110) silicon wafer, one plate side oriented along <110> and the other side along <100>.

6. The resonator array according to claim 1, wherein said resonance mode is a Wine glass mode.

7. The resonator array according to claim 6, wherein the resonator elements comprise
- disk-shaped plates made from (100) silicon wafer and symmetrically anchored at four points of the disk, virtual lines connecting the anchors at opposite sides of the disk are oriented along the <100> directions, or
- disk-shaped plates made from (110) silicon wafer and symmetrically anchored at four points of the disk, one virtual line connecting the anchors at opposite sides is oriented along <110> direction, and the other such line is oriented along <100>.

8. The resonator array according to claim 1, wherein the resonator elements have at least four axes of reflection symmetry in the lateral plane.

9. The resonator array according to claim 1, wherein the resonator elements and the piezoelectric transducer element comprise a common semiconductor layer.

10. The resonator array according to claim 1, wherein the piezoelectric transducer element is mechanically coupled to both of the resonator elements through unitary bridges between the piezoelectric transducer element and the resonator elements.

11. The resonator array according to claim 1, wherein the array comprises a two-dimensional matrix of at least three resonator elements and at least one piezoelectric transducer element arranged between one pair of resonator elements.

12. The resonator array according to claim 1, wherein the array comprises at least two piezoelectric transducer elements arranged between different pairs of resonator elements and adapted to oscillate in the same phase or 180 degrees out-of-phase, depending on their location in the matrix.

13. The resonator array according to claim 12, wherein the array comprises at least two piezoelectric transducer elements which are arranged to oscillate in the same direction.

14. The resonator array according to claim 12 or 13, wherein the array comprises at least two piezoelectric transducer elements which are arranged to oscillate in perpendicular directions.

15. The resonator array according to claim 1, wherein the array comprises at least two piezoelectric transducer elements attached on one sides thereof to a common point within the array and on other sides thereof to different resonator elements.

16. The resonator array according to claim 1, wherein the array comprises a plurality of adjacent resonator elements in continuous formation.

17. The resonator array according to claim 8, wherein the continuous formation defines a void having the size of one or more an individual resonator elements and the transducer element is arranged within said void.

18. The resonator array according to claim 1, wherein the array is of square or rectangular outer shape.

19. The resonator array according to claim 1, wherein the resonator elements are manufactured from a doped semiconductor layer.

20. The resonator array according to claim 19, wherein the doping concentration in said semiconductor layer is such that the absolute value temperature coefficient of frequency TCF of the resonance frequency of the plate is smaller in magnitude than 30 ppm/K.

21. The resonator array according to claim 19 or 20, wherein the doping concentration in said semiconductor layer is at least $10^{19}$ cm$^{-3}$.

22. The resonator array according to claim 1, wherein each of the resonator elements is an individual square plate or a square subplate being part of larger resonator body.

23. The resonator array claim 1, wherein the at least one transducer element comprises a piezoelectric transducer element comprising a semiconductor layer manufactured from the same semiconductor layer as the at least two resonator elements and a piezoelectric layer, and further an electrode layer arranged thereon.

24. The resonator array according to claim 1, wherein the contribution of any non-$c_{44}$ elastic parameter of the stiffness matrix of the semiconductor material to the resonance frequency of the resonator is less than 20%.

25. A method of manufacturing a microelectromechanical resonator array comprising
- providing a semiconductor wafer having a device layer,
- forming from said device layer at least two resonator elements so that the resonator elements are located laterally with respect to each other as an array,
- forming from the device layer at least one transducer element portion located laterally with respect to the resonator elements and mechanically coupled to said resonator elements,
- depositing a piezoelectric layer on top of said transducer element portion, and
- forming an electrical contact to said piezoelectric layer so as to form a transducer element capable of piezoelectrically exciting a Lamé resonance mode in the resonator elements.

26. A method of providing a frequency signal for an electronic device comprising a resonator according to claim 1, comprising
- providing an electrical drive signal to the piezoelectric transducer element in order to cause the resonator elements of the resonator array to oscillate in said resonance mode,
- providing said frequency signal from a sense transducer coupled to the resonator array,
- conducting the frequency signal to another part of the electronics device.

27. The resonator array according to claim 9, wherein the resonator elements and the piezoelectric transducer element comprise a common semiconductor layer which is a silicon layer.

28. The resonator array according to claim 15, wherein the array comprises four piezoelectric transducer elements attached on one sides thereof to a common point within the array and on other sides thereof to different resonator elements.

29. The resonator array according to claim 16, wherein each resonator element consists of a combination of basic square-plate unit acting as a virtual square Lamé resonator.

30. The resonator array according to claim 19, wherein the doped semiconductor layer is p+-doped.

31. The resonator array according to claim 19, wherein the doped semiconductor layer is p+-doped by being boron-doped.

32. The resonator array according to claim 19, wherein the doped semiconductor layer is a silicon layer that is p+-doped by being boron-doped.

33. The resonator array according to claim 20, wherein the doping concentration in said semiconductor layer is such that the absolute value temperature coefficient of frequency TCF of the resonance frequency of the plate is smaller in magnitude than 20 ppm/K.

34. The resonator array according to claim 20, wherein the doping concentration in said semiconductor layer is such that the absolute value temperature coefficient of frequency TCF of the resonance frequency of the plate is smaller in magnitude than 10 ppm/K.

35. The resonator array claim 23, wherein the at least one transducer element comprises a piezoelectric transducer element comprising a semiconductor layer manufactured from the same semiconductor layer as the at least two resonator elements and a piezoelectric layer, which is an AlN, ZnO, or PZT layer.

* * * * *